United States Patent
Hollis et al.

(10) Patent No.: US 10,164,817 B2
(45) Date of Patent: Dec. 25, 2018

(54) METHODS AND APPARATUSES FOR SIGNAL TRANSLATION IN A BUFFERED MEMORY

(71) Applicant: MICRON TECHNOLOGY, INC., Boise, ID (US)

(72) Inventors: Timothy M. Hollis, Meridian, ID (US); Dean Gans, Nampa, ID (US); Randon Richards, Kuna, ID (US); Bruce W. Schober, Vienna, VA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/465,421

(22) Filed: Mar. 21, 2017

(65) Prior Publication Data

US 2018/0278461 A1 Sep. 27, 2018

(51) Int. Cl.
 *H04L 12/24* (2006.01)
 *H04L 12/863* (2013.01)
 *H04L 25/03* (2006.01)

(52) U.S. Cl.
 CPC .... *H04L 41/0226* (2013.01); *H04L 25/03885* (2013.01); *H04L 47/6225* (2013.01)

(58) Field of Classification Search
 CPC ............ H04L 7/0008; H04L 25/03273; H04L 12/422; H04L 41/0226
 USPC ................................................. 375/354–359
 See application file for complete search history.

(56) References Cited

U.S. PATENT DOCUMENTS

| | | | |
|---|---|---|---|
| 4,298,929 A | 11/1981 | Capozzi | |
| 5,166,956 A * | 11/1992 | Baltus | H04L 25/4917 341/56 |
| 6,285,624 B1 * | 9/2001 | Chen | G11C 7/1006 365/185.03 |
| 7,013,359 B1 | 3/2006 | Li | |
| 7,617,356 B2 | 11/2009 | Bains | |
| 8,291,139 B2 | 10/2012 | Hollis | |
| 8,553,459 B2 | 10/2013 | Shinozaki et al. | |
| 8,760,328 B1 * | 6/2014 | Koay | H03M 9/00 341/100 |
| 9,577,854 B1 | 2/2017 | Hollis | |
| 2005/0135489 A1 | 6/2005 | Ho et al. | |
| 2006/0107154 A1 * | 5/2006 | Bansal | G01R 31/31716 714/738 |

(Continued)

FOREIGN PATENT DOCUMENTS

CN 101556572 A 10/2009

OTHER PUBLICATIONS

International Search Report and Written Opinion dated Jul. 11, 2018 for PCT Application No. PCT/US2018/022919, 10 pages.

(Continued)

*Primary Examiner* — Emmanuel Bayard
(74) *Attorney, Agent, or Firm* — Dorsey & Whitney LLP

(57) ABSTRACT

According to one embodiment, A data buffer is described. The data buffer comprises a first input/output circuit configured to receive and provide a first signal encoded according to a first communications protocol, a second input/output circuit configured to receive and provide a second signal encoded according to a second communications protocol, and a conversion circuit coupled to the first and second input/output circuits and configured to convert the first signal to the second signal and to convert the second signal to the first signal.

8 Claims, 13 Drawing Sheets

(56) References Cited

U.S. PATENT DOCUMENTS

| | | | |
|---|---|---|---|
| 2006/0248422 A1* | 11/2006 | Puvvada | G01R 31/318594 |
| | | | 714/733 |
| 2007/0126479 A1* | 6/2007 | Hur | G11C 7/1006 |
| | | | 326/93 |
| 2009/0225873 A1 | 9/2009 | Lee et al. | |
| 2012/0269206 A1* | 10/2012 | Zid | H03M 9/00 |
| | | | 370/535 |
| 2013/0145088 A1 | 6/2013 | Frost et al. | |
| 2014/0029331 A1* | 1/2014 | Gopalakrishnan | |
| | | | G11C 11/4063 |
| | | | 365/149 |
| 2014/0177645 A1 | 6/2014 | Cronie et al. | |
| 2015/0180994 A1 | 6/2015 | Hollis | |
| 2016/0019182 A1 | 1/2016 | Clements et al. | |
| 2017/0054580 A1 | 2/2017 | Hollis | |
| 2017/0132162 A1 | 5/2017 | Hollis | |
| 2017/0155529 A1* | 6/2017 | Aung | H04L 25/03273 |

OTHER PUBLICATIONS

Parrish, Kevin "Samsung's 8Gb LPDDR4 Chip Brings 4GB DDR4 to Mobile", Samsung'S 8Gb LPDDR4 Chip Brings 4GB DDR4 to Mobile, Samsung Press Release, Dec. 30, 2013, pp. all captured from www.tomshardware.com/news on Sep. 12, 2018.

\* cited by examiner

METHODS AND APPARATUSES FOR SIGNAL TRANSLATION IN A BUFFERED MEMORY

BACKGROUND

Buffered memory systems, also known as registered memory, such as load reduced dual in-line memory modules (LRDIMM) include one, or more buffers or registers between the memory controller or host system (e.g., a processor issuing memory commands) and the memory. Buffered memory systems may improve system stability as the number of memory modules in the system increases by reducing the electrical load on the host system compared to unbuffered memory systems. The buffers may be command buffers, address buffers, data buffers, or some combination thereof. Traditional buffered memory systems maintain a 1:1 ratio in data speed between the host and the memory. That is, the host and memory traditionally operate at the same clock frequency. This limits overall system performance because transistor response within the memory is typically slower than processor speeds. Thus, system performance is limited by transistor response within the memory device.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Embodiments disclosed herein overcome the limitations of traditional systems in which chips of unequal speed capabilities communicate. For clarity, examples described herein are presented in the context of computer memory systems. However, other applications are possible to improve the performance of systems in which chips of different speed capabilities communicate. For example, communication implementing fin field-effect transistors (FinFETs) in processors, and/or legacy transistors in a modem. One specific application may be improving the performance of buffered memory systems by converting binary signals on the host side of the data buffer to multilevel signals on the memory side of the data buffer and vice versa. By encoding data in multilevel signals on the memory side of the data buffer, the speed of the clock used to capture the data in the memory may be reduced (e.g., reduced frequency), thereby reducing the impact of transistor response as a limiting factor in memory speeds. Embodiments disclosed herein may confer several benefits. For example, signal margin may increase. Lower clock frequency operation may result in improved thermal properties of the device by reducing power consumption. The system may scale with additional memories added to the memory system.

Figure 1:
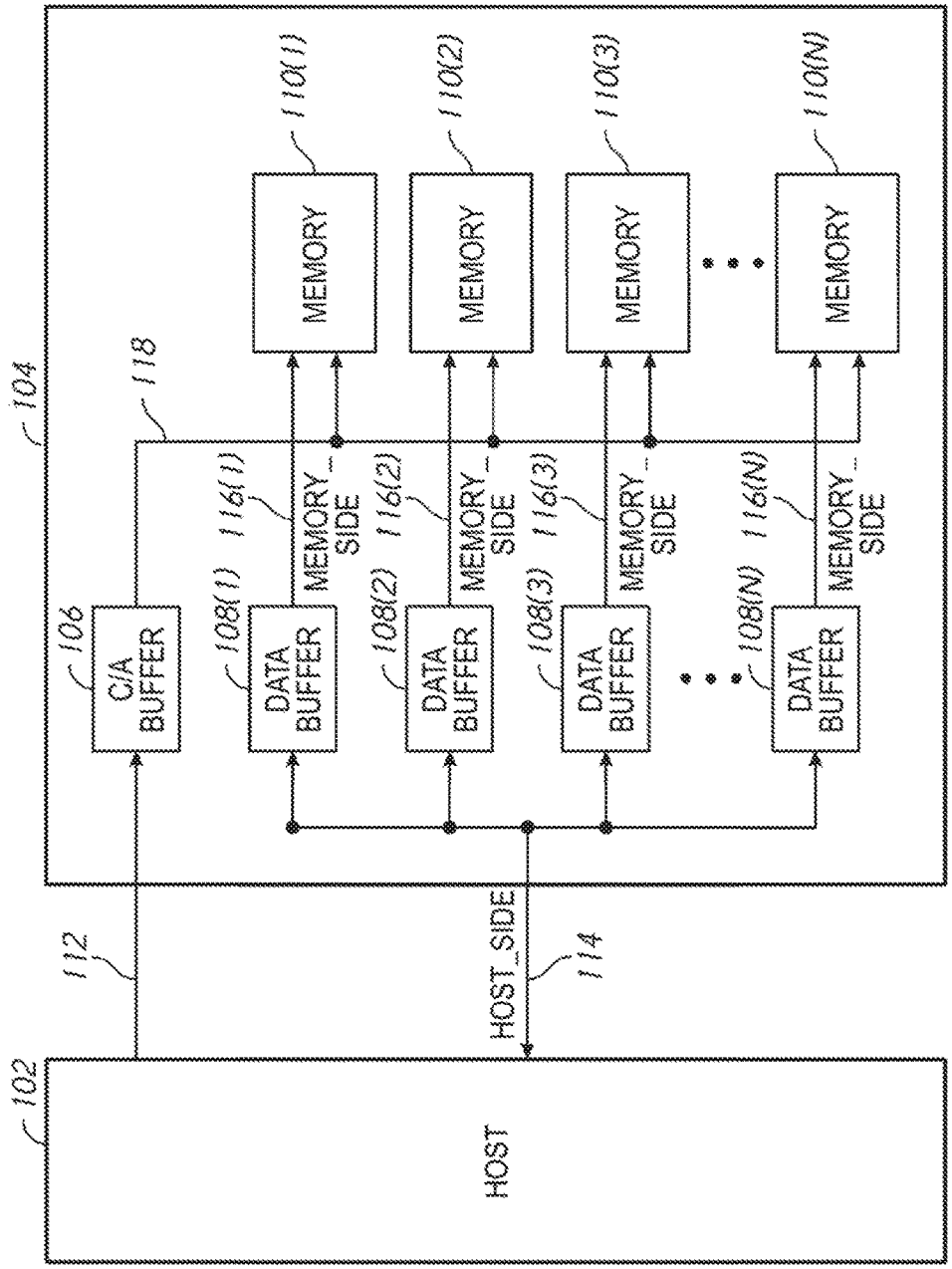
FIG. 1 is a block diagram of a memory system in accordance with an embodiment of the present invention.

FIG. 1 is a block diagram of a memory system, generally designated 100, in accordance with an embodiment of the present invention. The memory system 100 includes a host 102 and a memory device 104. The host 102 provides instructions to the memory device 104 to perform memory operations, such as read and write operations. The host 102 may provide command information and/or address information to the memory device 104 over a command/address bus 112. The host 102 may provide and receive data associated with memory operations via a host-side data bus 114. The host 102 may be, for example, a memory controller or processor, such as a central processing unit or a graphics processing unit.

The memory 104 is a buffered memory device including a command/address buffer 106 coupled to the command/address bus 112, a plurality of data buffers 108(1)-(N) coupled to the host-side data bus 114, and a plurality of memories 110(1)-(N) coupled to a respective data buffer 108(1)-(N) over a respective memory-side data bus 116(1)-(N). The memory device 104 may receive the command and/or address information via the command/address bus 112 and receive and/or provide a data signal, such as the HOST_SIDE signal, via the host-side data bus 114. In response to the command/address information, and/or the received HOST_SIDE signal, the memory device 104 may perform memory operations and return information, such as read data or write confirmation information, to the host 102 via the host-side data bus 114. The command/address buffer 106 may receive command/address information from the host 102 via the command/address bus 112 and provide the command/address information to one or more of the plurality of memories 110(1)-(N) via an internal command/address bus 118.

The host-side data bus 114 may be configured to carry a data signal, such as the HOST_SIDE signal between the host 102 and the memory device 104. The HOST_SIDE signal may be encoded according to a first communications protocol. The communications protocol may specify a system of rules that allow two or more devices to communicate over the host-side data bus. The first communications protocol may be, for example a communication protocol associated with a particular type of memory device, such as Double Data Rate-4 (DDR4), Low Power DDR4 (LPDDR4), LPDDR4x, DDR3, Serializer/Deserializer (SERDES) (e.g., PCI Express, PCIe 3, etc.), etc. In some embodiments, the HOST_SIDE signal may be a binary signal having two possible logic states (e.g., logic 0 or 1).

Each data buffer 108 of the plurality of data buffers 108(1)-(N) is configured to receive the HOST_SIDE signal, which is encoded according to a first communication protocol, and convert the HOST_SIDE signal to a MEMORY_SIDE signal encoded according to a second communication protocol and vice versa. The second communications protocol may be associated with a particular type of memory, such as DDR4, LPDDR4, LPDDR4x, DDR3, SERDES, etc. In some embodiments, the MEMORY_SIDE signal may be a multilevel signal. For example, two bits may be encoded as a single voltage level corresponding to a logical state of those two bits (e.g., logic 00, 01, 10, or 11). Other types of multilevel signals may also be used. By translating between the HOST_SIDE signal and the MEMORY_SIDE signal, the data buffers 108(1)-(N) enable the host to communicate with the memory device 104 using a first communications protocol and each of the memories 110(1)-(N) to operate using data input that is encoded according to a second communications protocol. For example, in one embodiment, a data buffer 108 may receive a HOST_SIDE signal encoded for a DDR4 memory, and convert the received signal to a MEMORY_SIDE signal encoded for an LPDDR4 memory. As another example, a data buffer 108 may convert a HOST_SIDE signal encoded as a binary signal (e.g., a binary pulsed amplitude modulation (PAM2) signal) to a MEMORY_SIDE signal encoded as a multilevel signal (e.g., a PAM4 signal). In such an embodiment, clock signals may be relaxed on the memory side of the data buffer 108 while maintaining or increasing the total data bandwidth because more data is encoded in each data symbol (e.g., the voltage level sampled during a data eye).

Each data buffer 108 may be configured to communicate with a respective memory 110 over a respective memory-side bus 116. The memory-side buses 116(1)-(N) may be relatively short, clean channels compared to the host-side data bus. For example, the memory-side data, buses 116(1)-(N) may each be less than 20 mm. Other lengths may also be used. By limiting the length and noise on the memory-side data buses 116(1)-(N), the number of bits encoded in each data symbol may be increased because finer divisions between voltage levels may be transmitted without noise compromising the signal integrity.

The memories 110(1)-(N) may generally be any type of memory capable of performing memory operations and receiving/providing the MEMORY_SIDE signal encoded according to the second communications protocol. For example, in embodiments where the MEMORY_SIDE signal is encoded according to a DDR4 protocol, then the memory 110 may be configured to receive, transmit, and perform memory operations with data encoded according to a DDR4 protocol. Similarly, in embodiments where the MEMORY_SIDE signal is encoded as a multilevel signal, the memory 110 may be configured to receive and decode the multilevel signal.

Figure 2:
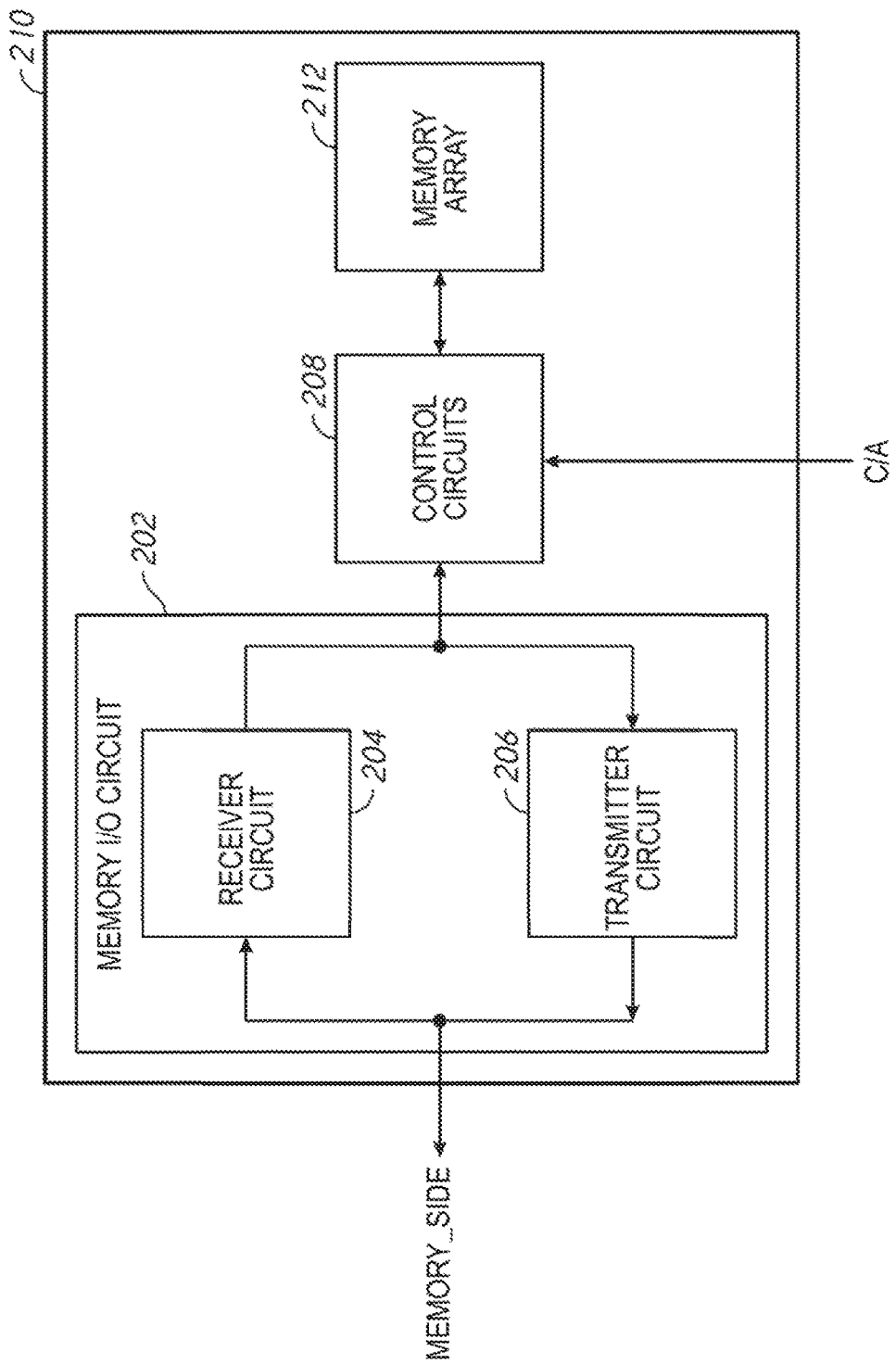
FIG. 2 is a block diagram of a memory, in accordance with an embodiment of the present invention.

FIG. 2 is a block diagram of memory, generally designated 210, in accordance with an embodiment of the present invention. The memory 210 includes a memory I/O circuit 202, a control circuit 208 and a memory array 212. The memory array 210 may be implemented as one or, more of the memories 110(1)-(N) of FIG. 1.

The memory I/O circuit 202 includes a receiver circuit 204 and a transmitter circuit 206. The receiver circuit 204 may be configured to receive the MEMORY_SIDE signal encoded according to the second communications protocol. In embodiments where the MEMORY_SIDE signal is a multilevel signal, the receiver circuit 204 may include, for example, one or more multilevel receivers and a decoder circuit. The transmitter circuit 206 may be configured to provide the MEMORY_SIDE signal encoded according to the second communications protocol. The transmitter circuit 206 may include, for example, one or more signal driver circuits. In embodiments where the MEMORY_SIDE signal is a multilevel signal, the transmitter circuit 206 may include a multilevel driver circuit.

The control circuit 208 may be configured to provide control signals to the memory array 212 based on received command/address information, such as that provided by the command/address buffer 106 of FIG. 1. The control circuit 208 may, for example, provide control signals to the memory array 212 to execute a read operation, a write operation, a refresh operation, or any other memory operation.

The memory array 212 may include a plurality of memory cells. The memory cells may be volatile or non-volatile memory cells. For example, the memory cells may be DRAM memory cells, flash memory cells, phase change memory cells, or any other type of memory cells. The memory cells of the memory array 212 may be arranged in any architecture.

Figure 3:
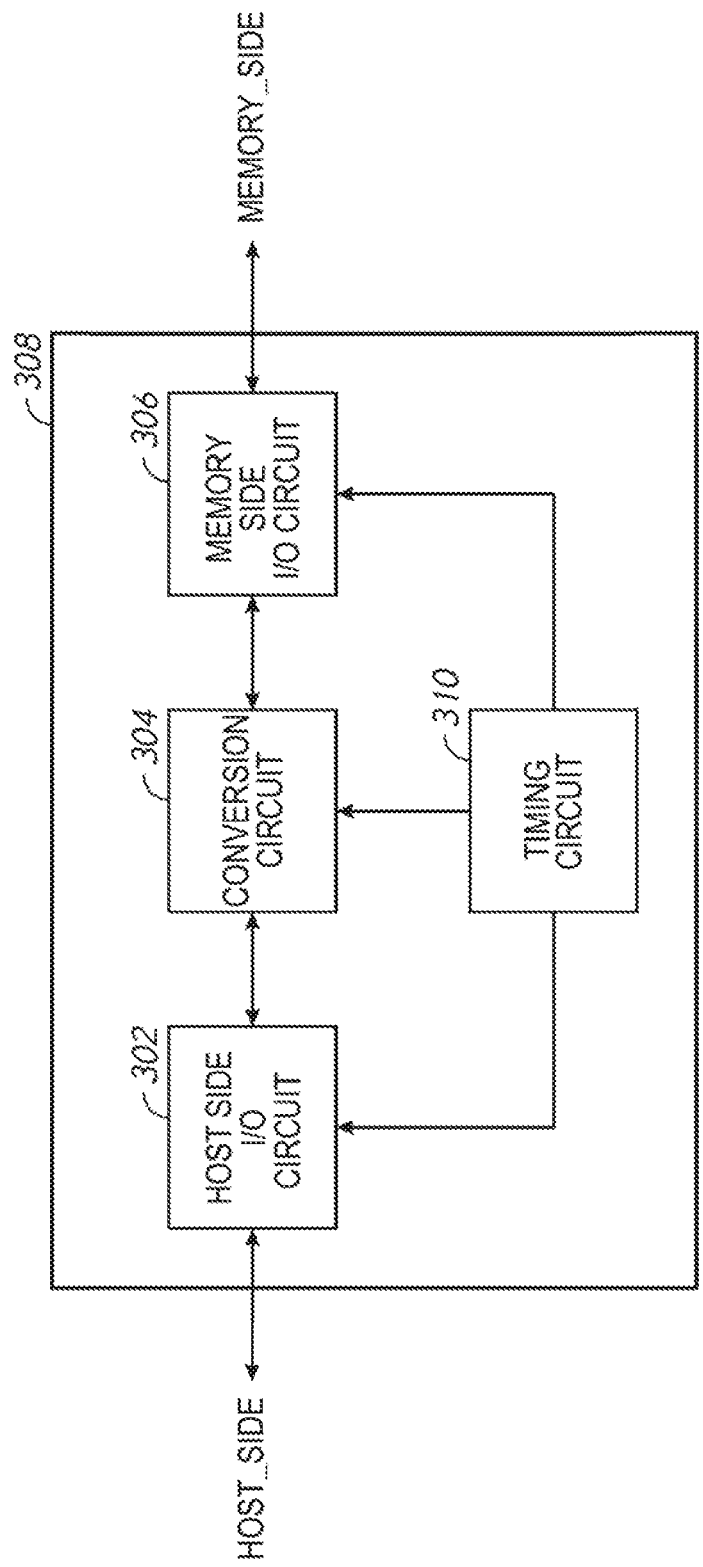
FIG. 3 is a block diagram of a data buffer, in accordance with an embodiment of the present invention.

FIG. 3 is a block diagram of a data buffer, generally designated 308, in accordance with an embodiment of the present invention. The data buffer 308 may be implemented as one or more of the data buffers 108(1)-(N) of FIG. 1. The data buffer 308 may include a host side I/O circuit 302, a conversion circuit 304, a memory side I/O circuit 306, and a timing circuit 310. The data buffer 308 may be a bidirectional buffer configured to convert a HOST_SIDE signal encoded according to a first communication protocol to a MEMORY_SIDE signal encoded according to a second communications protocol and vice versa.

The host side I/O circuit 302 may be configured to receive and provide the HOST_SIDE signal encoded according to a first communications protocol. The host side I/O circuit may include, for example, one or more latches, signal driver circuits, or other circuits for receiving and sending signals. In one embodiment the host side I/O circuit 302 comprises a binary transmitter and a binary receiver circuit. In general, the host side I/O circuit 302 may include any receiver and/or transmitter configured to send and receive signals encoded according to the first communications protocol. An example host side I/O circuit 302 is described in further detail below with respect to FIG. 4.

The conversion circuit 304 may be configured to convert the HOST_SIDE signal encoded according to a first protocol and received by the host side I/O circuit 302 to the MEMORY_SIDE signal encoded according to a second communications protocol and vice versa. The conversion circuit 304 may include, for example, a deserializer circuit for converting serial binary signals (e.g., the HOST_SIDE signal) to parallel binary signals, which may then be converted into a multilevel signal (e.g., the MEMORY_SIDE signal). The conversion circuit 304 may also include, for example, a serializer circuit for converting parallel binary signals (e.g., derived from a multilevel, MEMORY_SIDE signal) and converting them into serial binary signals for transmission as a binary signal (e.g., the HOST_SIDE signal). In various other embodiments, the conversion circuit 304 may convert between other types of communication protocols. Example conversion circuits are described in further detail below with respect to FIGS. 4-8.

The memory side I/O circuit 306 may be configured to receive and provide the MEMORY_SIDE signal encoded accorded to a second communications protocol. The memory side I/O circuit 306 may include, for example, receiver circuits and transmitter circuits. In some embodiments, the receiver circuits and transmitter circuits are configured to receive and provide a multilevel MEMORY_SIDE signal, respectively. In such embodiments, the memory side I/O circuit 306 may further include decoder circuits for decoding a received multilevel MEMORY_SIDE signal.

The timing circuit 310 may be configured to control the timing of signals in the host side I/O circuit 302, the conversion circuit 310, and/or the memory side I/O circuit 306. In various embodiments, the timing circuit may provide one or more clock signals and may be, for example, a phase locked loop (PLL) or a delay locked loop (DLL). In embodiments where the data buffer 308 is configured to convert between a binary HOST_SIDE signal and a multilevel MEMORY_SIDE signal, the timing circuits may be configured to provide a first clock signal have a first frequency to the host side I/O circuit 302 and to provide a second clock signal having a second frequency to the memory side I/O circuit 306. In some embodiments, the second frequency may be half the first frequency. Although shown as part of the data buffer 308, those skilled in the art will appreciate that the timing circuit 310 may be located externally to the data buffer 308. For example, the timing circuit may be a separate circuit in the memory device 104.

Figure 4:
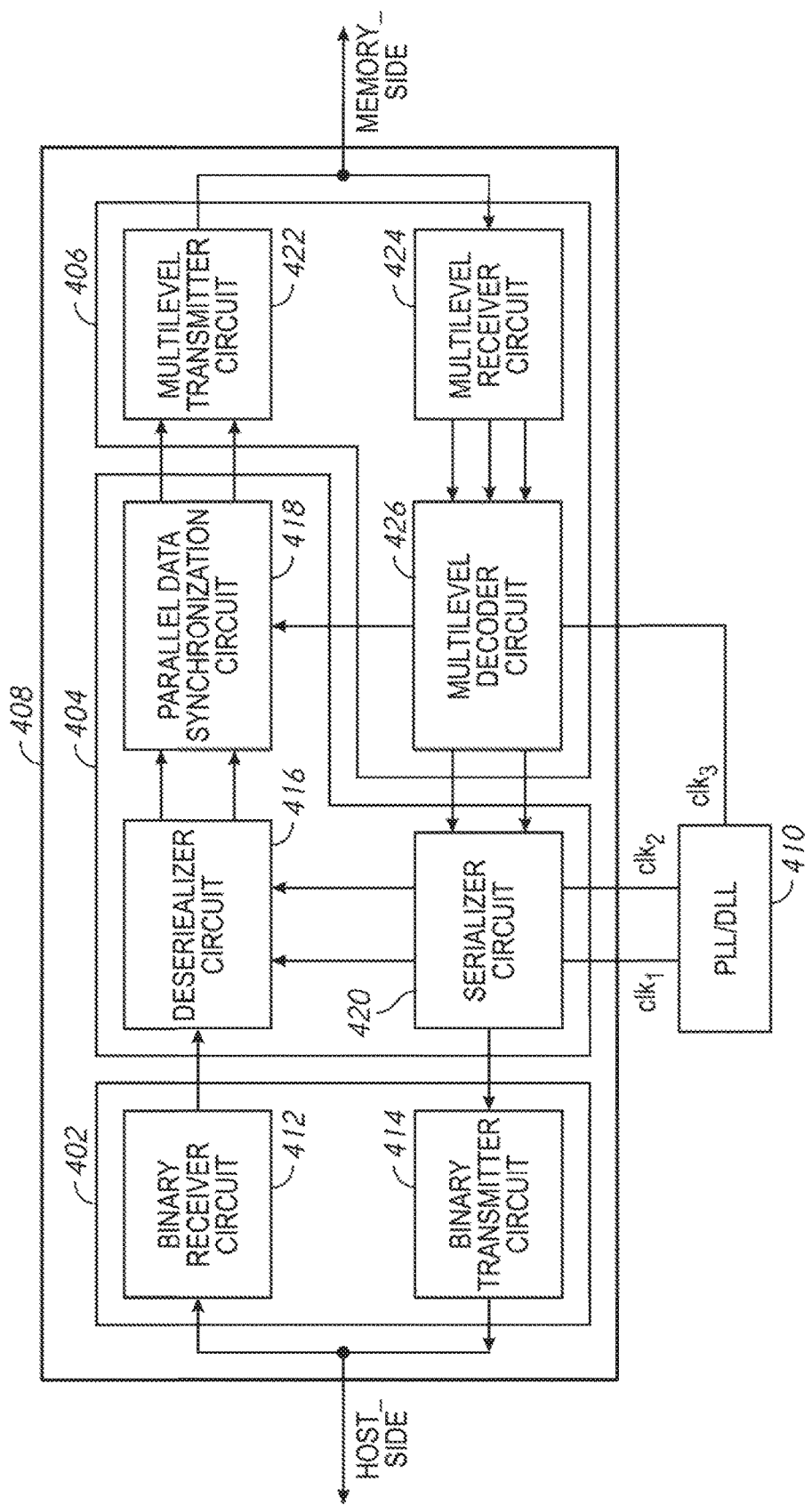
FIG. 4 is a block diagram of a data buffer for converting between a binary signal and a multilevel signal, in accordance with an embodiment of the present invention.

FIG. 4 is a block diagram of a data buffer, generally designated 408, for converting between a binary signal and a multilevel signal, in accordance with an embodiment of the present invention. As described with respect to FIG. 4, the HOST_SIDE signal is a binary signal and the MEMORY_SIDE signal is a multilevel signal. However, those skilled in the art will appreciate that the data buffer 408 may be reversed such that the HOST_SIDE signal is a multilevel signal and the MEMORY_SIDE signal is a binary signal. The data buffer 408 may be implemented as the data buffer 308 of FIG. 3 and/or one or more of the data buffers 108(1)-(N) of FIG. 1. The data buffer 408 may include a host side I/O circuit 402, a conversion circuit 404, and a memory side I/O circuit 406, which may be implemented as the host side I/O circuit 302, the conversion circuit 304, and the memory side I/O circuit 306 of FIG. 3, respectively.

The host side I/O circuit 402 includes a binary receiver circuit 412 and a binary transmitter circuit 414. The binary receiver circuit 412 may be a circuit configured to receive a binary HOST_SIDE signal and to provide the received signal to the conversion circuit 404. The binary receiver circuit 412 may include, for example, an amplifier circuit configured to amplify the received HOST_SIDE signal. The binary receiver circuit 412 may include additional filtering or equalization circuits, such as a decision feedback equalizer. Generally, the binary receiver circuit 412 may be any circuit that can receive and propagate a serial binary signal.

The binary transmitter circuit 414 may be a circuit configured to provide a binary HOST_SIDE signal. The binary transmitter circuit 414 may include, for example, one or more driver circuits configured to drive the binary HOST_SIDE signal. In various embodiments, the binary transmitter circuit 414 may be configured to provide the binary HOST_SIDE signal based on a clock signal having a first frequency.

Figure 6:
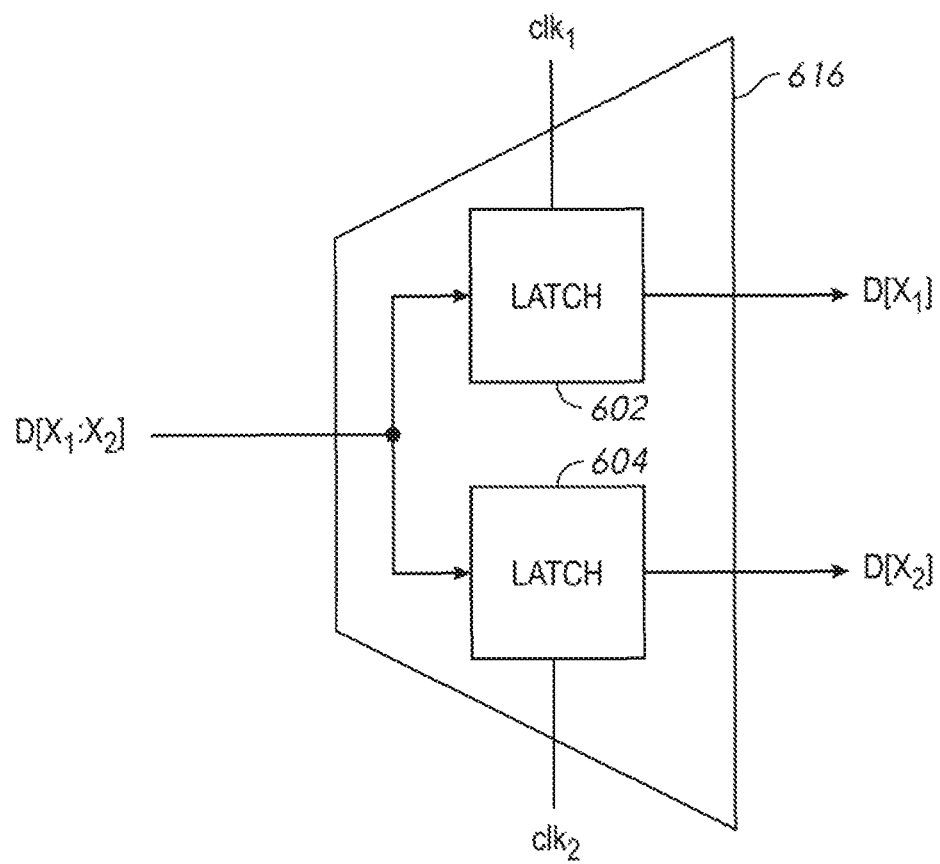
FIG. 6 is a block diagram of a deserializer circuit, in accordance with an embodiment of the present invention.

In the embodiment of FIG. 4, the conversion circuit 404 may be configured to convert serial data bits into parallel data bits and to convert parallel data bits into serial data bits. The parallel data bits may then encoded as or decoded from a multilevel signal (e.g., the MEMORY_SIDE signal) and the serial data bits may be encoded as or decoded from a binary signal (e.g., the HOST_SIDE signal). The conversion circuit 404 may include a deserializer circuit 416, a parallel data synchronization circuit 418, and a serializer circuit 420. The deserializer circuit 416 may be configured to receive the binary HOST_SIDE signal from the binary receiver circuit 412, convert received serial bits of the binary HOST_SIDE signal into a parallel signal and provide the parallel signal to the parallel data synchronization circuit 418. An example deserializer circuit 616 is shown in FIG. 6. The deserializer circuit 616 may include a first latch 602 and a second latch 604. A serial binary signal D may be provided to the first latch 602 and the second latch 604. The signal D may be received, for example, from the binary receiver circuit 412. As shown in FIG. 6, the signal D includes a first data bit $D[X_1]$ and a second data bit $D[X_2]$. The first latch 602 may be configured to latch the first data bit $D[X_1]$ at a first time based on a first clock signal $clk_1$, which may be provided by a timing circuit, such as the PLL/DLL 410. The second latch 604 may be configured to latch the second data bit $D[X_2]$ at a second time based on a second clock signal $clk_2$, which may be provided by a timing circuit, such as the PLL/DLL 410. The first clock signal $clk_1$ and the second clock signal $clk_2$ may be complementary. The first and second latches 602 and 604 may output the first and second bits $D[X_1]$ and $D[X_2]$, respectively, in parallel.

Returning again to FIG. 4, the parallel data synchronization circuit 418 may be configured to receive parallel data bits (e.g., parallel data bits $D[X_1]$ and $D[X_2]$) and to provide synchronized parallel data bits (e.g., align the rising and/or falling edges of the data signals with a common clock signal). The data synchronization circuit 418 may include one or more latches, passgates, or other circuits that are configured to synchronize the parallel data bits $D[X_1]$ and $D[X_2]$ based on a third clock signal $clk_3$ provided by the PLL/DLL circuit 410. In various embodiments, the third clock signal $clk_3$ may have a frequency that is double the frequency of the first clock signal $clk_1$ and the second clock signal $clk_2$.

Figure 7:
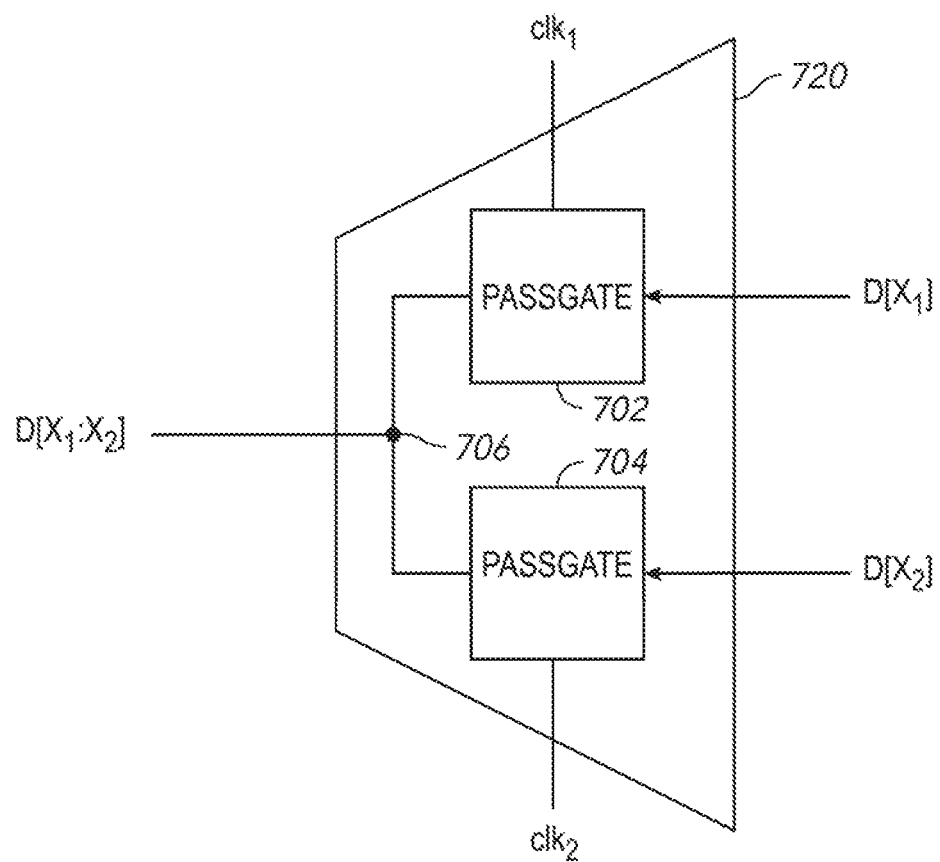
FIG. 7 is a block diagram of a serializer circuit, in accordance with an embodiment of the present invention.

The serializer circuit 420 may be configured to receive parallel data bits and to provide the data bits in a serial binary signal. The serializer circuit may provide the binary signal based on a first clock signal $clk_1$ and a second clock signal $clk_2$. The serializer circuit 420 may include, for example, passgates for controlling the transmission of the data bits based on the first and second clock signals. An example serializer circuit 720 is shown in FIG. 7. The serializer circuit 720 may be implemented as the serializer circuit 420 of FIG. 4. The serializer circuit includes a first passgate 702 and a second passgate 704. The first passgate 702 and the second passgate 704 may be, for example, transistors. The first passgate is configured to receive a first parallel data bit $D[X_1]$ and a first clock, signal $clk_1$. The second passgate 704 is configured to receive a second parallel data bit $D[X_2]$ and a second clock signal $clk_2$. The first clock signal $clk_1$ and the second clock signal $clk_2$ may be complementary clock signals. The first passgate 702 and the second passgate may have output terminals that are coupled to a common node 706. In operation, the first passgate 702 may be configured to provide the first parallel data bit $D[X_1]$ to the common node 706 when the first clock signal $clk_1$ is active (e.g., logic high) and the second passgate 704 may be configured to provide the second parallel data bit D[$X_2$] to the common node when the second clock signal clk$_2$ is active. In embodiments where the first clock signal clk$_1$ and the second clock signal clk$_2$ are complementary, the first passgate 702 and the second passgate 704 alternate between providing their respective outputs to the common node 706. Thus, the resulting output signal of the serializer circuit 720 is a serial binary signal D[$X_1$:$X_2$]. Returning again to FIG. 4, the output of the serializer circuit 420 may be provided to the binary transmitter circuit 414 to be encoded as a binary, signal (e.g., the HOST_SIDE signal).

The memory side I/O circuit 406 is configured to receive and provide a multilevel memory signal (e.g. the MEMORY_SIDE signal). The memory side I/O circuit 406 includes a multilevel transmitter circuit 422, a multilevel receiver circuit 424, and a multilevel decoder circuit 426.

Figure 8:
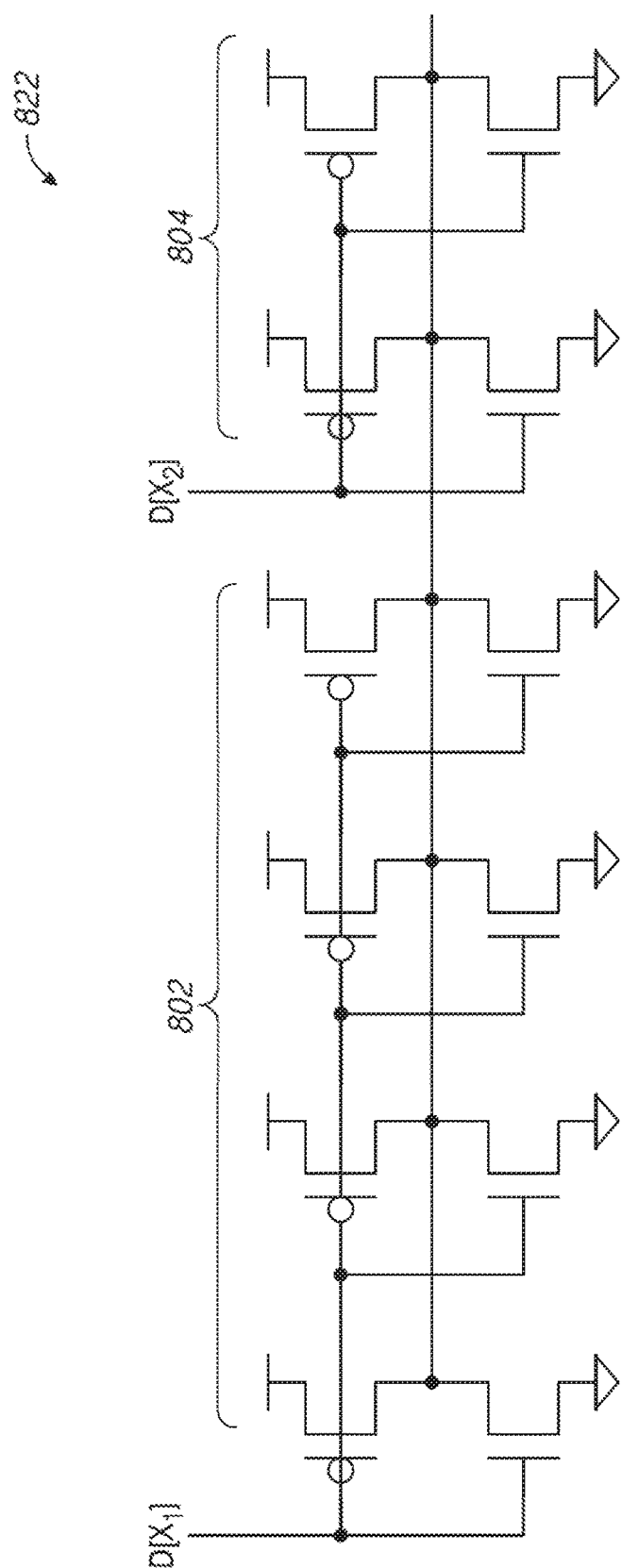
FIG. 8 is a circuit diagram of a multilevel transmitter circuit, in accordance with an embodiment of the present invention.

The multilevel transmitter circuit 422 may be configured to receive parallel data bits and to encode the parallel data bits as a multilevel signal. The multilevel transmitter circuit 422 may include one or more driver circuits. For example, the multilevel transmitter circuit may include a plurality of driver legs configured to drive a multilevel signal based on the parallel data bits. An example multilevel transmitter circuit 822 is shown in FIG. 8. The multilevel transmitter circuit 822 may be implemented as the multilevel transmitter circuit 422 of FIG. 4. The multilevel transmitter 822 includes a first plurality of driver legs 802 and a second plurality of driver legs 804. In the embodiment of FIG. 8, the first plurality of driver legs 802 includes four driver legs while the second plurality of driver legs includes two driver legs. However, other numbers and combinations of driver legs may also be used. Each driver leg may include a pair of transistors coupled in series between a first voltage (e.g., Vcc) and a second voltage (e.g., ground). Nodes between the first and second transistors may be coupled in common and configured to provide the MEMORY_SIDE signal. The first plurality of driver legs may be configured to be activated based on a first parallel data bit D[$X_1$], which may be received from the parallel data synchronization circuit 418 of FIG. 4. The second plurality of driver legs 804 may be configured to be activated based on a second parallel data bit D[$X_2$], which may be received from the parallel data synchronization circuit 418 of FIG. 4.

In operation, the drive strength of the multilevel transmitter circuit 822 is adjusted based on the value of the parallel data bits. For example, if D[$X_1$] and D[$X_2$] are both logic low signals, then the MEMORY_SIDE signal may be driven at a first voltage by both pluralities of driver legs 802 and 804. If D[$X_1$] is logic low and D[$X_2$] is logic high, then the MEMORY side signal may be driven at a second voltage by only the first plurality of driver legs 802. If D[$X_1$] is logic high and D[$X_2$] is logic low, then the MEMORY side signal may be driven at a third voltage by only the second plurality of driver legs 804. If D[$X_1$] and D[$X_2$] are both logic high signals, then the MEMORY_SIDE signal may be pulled, to ground by both pluralities of driver legs 802 and 804.

Returning again to FIG. 4, the multilevel receiver circuit 424 may be configured to receive the multilevel MEMORY_SIDE signal and to compare the received MEMORY_SIDE signal to one or more reference voltages. The multilevel receiver circuit 424 may include one or more comparators to compare the received MEMORY_SIDE signal to the one or more reference voltages and to provide one or more signals indicative of whether the MEMORY_SIDE signal exceeds the one or more reference voltages. The multilevel decoder circuit 426 is configured to receive the output signals of the multilevel receiver circuit 424, to decode the received signals, and to provide parallel data bits that were encoded in the received multilevel MEMORY_SIDE signal.

Figure 9:
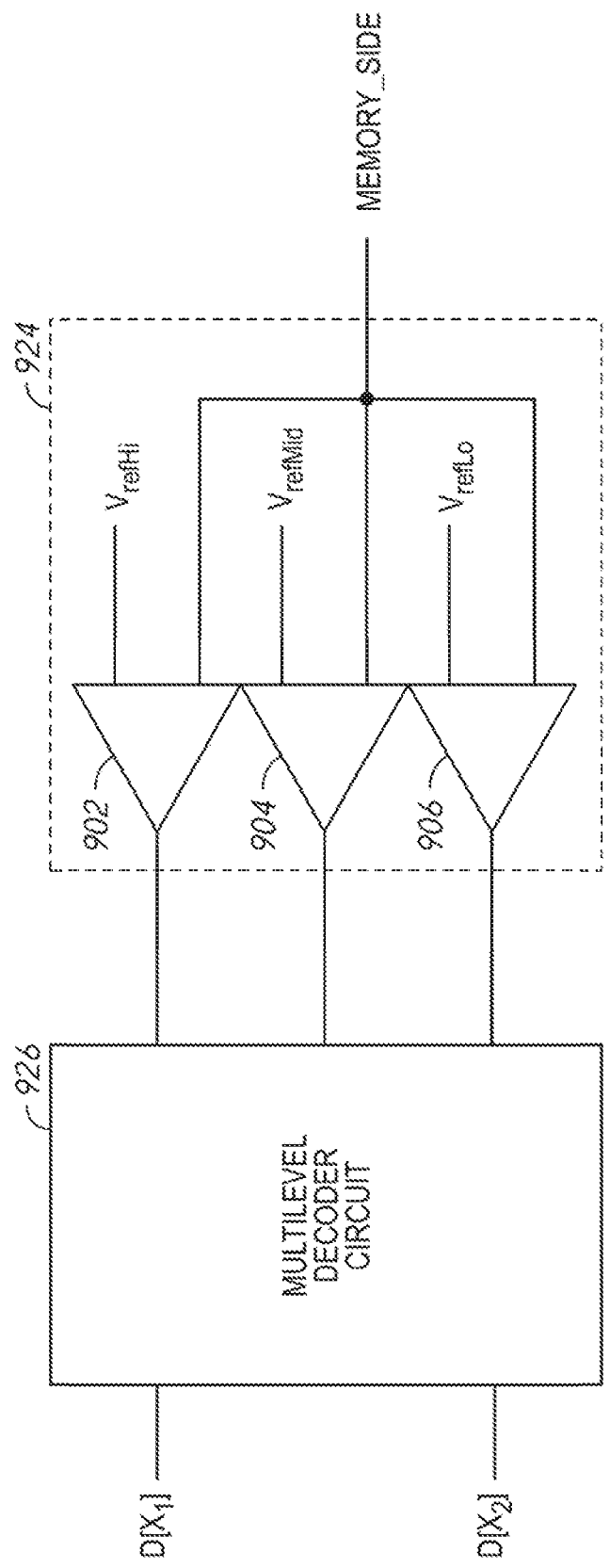
FIG. 9 is a block diagram of a multilevel receiver and a multilevel decoder circuit, in accordance with an embodiment of the present invention.

An example multilevel receiver circuit 924 is shown in FIG. 9. The multilevel receiver circuit 924 may be implemented as the multilevel receiver circuit 424. The multilevel receiver circuit 924 may be configured to receive a MEMORY_SIDE signal that encodes two data bits per symbol (e.g., each symbol may have one of four voltage levels corresponding to logic states 00, 01, 10, and 11). The multilevel receiver circuit 924 may include a first comparator 902, a second comparator 904, and a third comparator 906. The first comparator 902 may be configured to receive the MEMORY_SIDE signal and a first reference voltage $V_{refHi}$. The first comparator 902 may provide a first output signal indicative, of whether a voltage the MEMORY_SIDE signal exceeds the first reference voltage $V_{refHi}$. The second comparator 904 may be configured to receive the MEMORY_SIDE signal and a second reference voltage $V_{refMid}$. The second comparator 904 may provide a second output signal indicative of whether a voltage the MEMORY_SIDE signal exceeds the second reference voltage $V_{refMid}$. The third comparator 906 may be configured to receive the MEMORY_SIDE signal and a third reference voltage $V_{refLo}$. The third comparator 906 may provide a third output signal indicative of whether a voltage the MEMORY_SIDE signal exceeds the third reference voltage $V_{refLo}$. The first, second, and third reference voltages may be indicative of boundaries between different logic states of the multilevel MEMORY_SIDE signal. Thus, the outputs of the comparators 902-906 are indicative of logic state of the MEMORY_SIDE signal.

As an example, if the MEMORY_SIDE signal is less than all three of the reference voltages $V_{refHi}$, $V_{refMid}$, and $V_{refLo}$, then the comparators 902-906 may all provide a logic low output signal. If the MEMORY_SIDE signal is greater than all three of the reference voltages $V_{refHi}$, $V_{refMid}$, and $V_{refLo}$, then the comparators 902-906 may all provide a logic high output signal. If the MEMORY_SIDE signal is less than the first reference voltage $V_{refHi}$ but greater than the second reference voltage $V_{refMid}$, and the third reference voltage $V_{refLo}$, then the comparator 902 may provide a logical low output signal and the comparators 904 and 906 may provide logical high output signals. If the MEMORY_SIDE signal is less than the first reference voltage $V_{refHi}$ and the second reference voltage $V_{refMid}$, but greater than the third reference voltage. $V_{refLo}$, then the comparators 902 and 904 may provide a logical low output signal and the comparator 906 may provide a logical high output signal.

The multilevel decoder circuit 926 may include logic to decode the output signals of the multilevel receiver circuit 924 and to provide parallel data bits D[$X_1$] and D[$X_2$] (e.g., as parallel binary signals). In various embodiments, different combinations of output signals from the multilevel receiver circuit 924 correspond to different logic states of the MEMORY_SIDE signal. For example, if all three output signals of the multilevel receiver circuit are logic low, that state may correspond to a logic 00 state of the MEMORY_SIDE signal. The multilevel decoder circuit 926 may interpret the received output signal from the multilevel receiver circuit 924 and provide parallel data bits D[$X_1$] and D[$X_2$] both with voltage levels indicating logic 0. Similarly, if all three output signals of the multilevel receiver circuit are logic high, that state may correspond to a logic 11 state of the MEMORY_SIDE signal. The multilevel decoder circuit 926 may interpret the received output signal from the multilevel receiver circuit 924 and provide parallel data bits D[X₁] and D[X₂] both with voltage levels indicating logic 1. Other combinations of output signals may be decoded to provide parallel data bits D[X₁] and D[X₂] as 0 and 1 or 1 and 0, respectively. Returning again to FIG. 4, the parallel data bits D[X₁] and D[X₂] may be provided by the multilevel decoder circuit 426 to the serializer circuit 420 and processed as described above.

Figure 5:
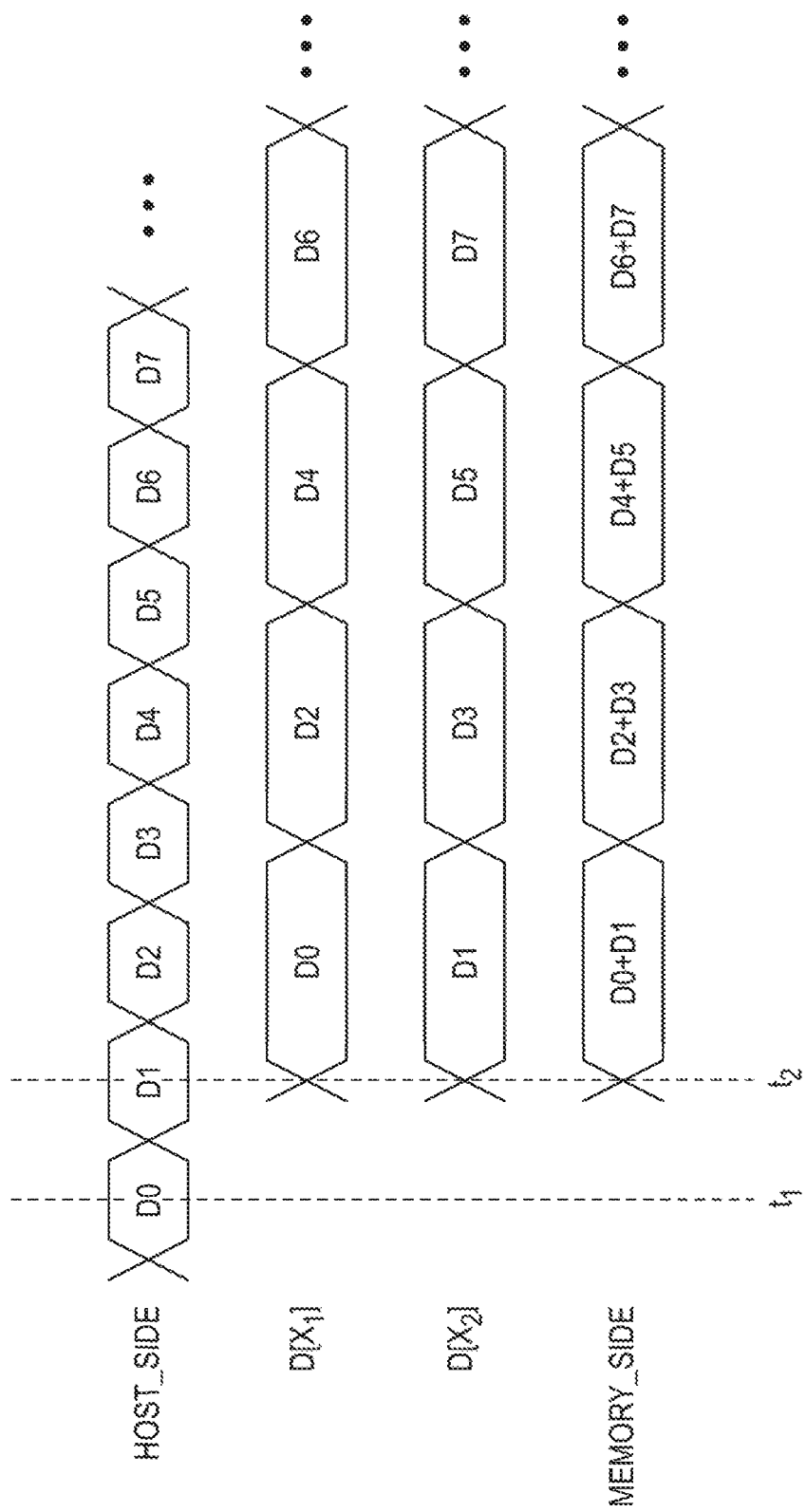
FIG. 5 is a timing diagram for a data buffer for converting a binary signal to a multilevel signal, in accordance with an embodiment of the present invention.

FIG. 5 is a timing diagram for a data buffer converting a binary HOST_SIDE signal to a multilevel MEMORY_SIDE signal, in accordance with an embodiment of the present invention. The HOST-SIDE signal may be a series of binary data bits D0-DN. For clarity, only data bits D0-D7 are shown in FIG. 5. The HOST_SIDE signal may have a first frequency. The HOST_SIDE signal may be received by the binary receiver circuit 412 and provided to the deserializer circuit 416. At times $t_1$ and $t_2$, the first and second data bits D0 and D1 may be latched, respectively, by the deserializer circuit 416, as described above with respect to FIGS. 4 and 6. The parallel data synchronization circuit 418 may synchronize the first and second data bits D0 and D1 and provide parallel data bits D[X₁] and D[X₂]. The parallel data bits D[₁] and D[X₂] may be clocked with a frequency that is half the frequency of the HOST_SIDE signal. Based on the parallel data bits D[X₁] and D[X₂], the multilevel transmitter circuit 422 may encode the first and second data bits D[X₁] and D[X₂] as a multilevel MEMORY_SIDE signal. As shown in FIG. 5, each data symbol of the MEMORY_SIDE signal encodes two data bits (e.g., D0 and D1, D2 and D3, etc.). The MEMORY_SIDE signal may be clocked with a frequency that is half the frequency of the HOST_SIDE signal. However, because each data symbol of the MEMORY_SIDE signal encodes two data bits, the bandwidth of the HOST_SIDE signal and the MEMORY_SIDE signal is maintained. Because the MEMORY_SIDE signal is clocked at half the frequency of the HOST_SIDE signal, the negative impact of transistor response time within the memory on the bandwidth of data transmitted may be reduced, and the performance of the memory may be improved.

Figure 10:
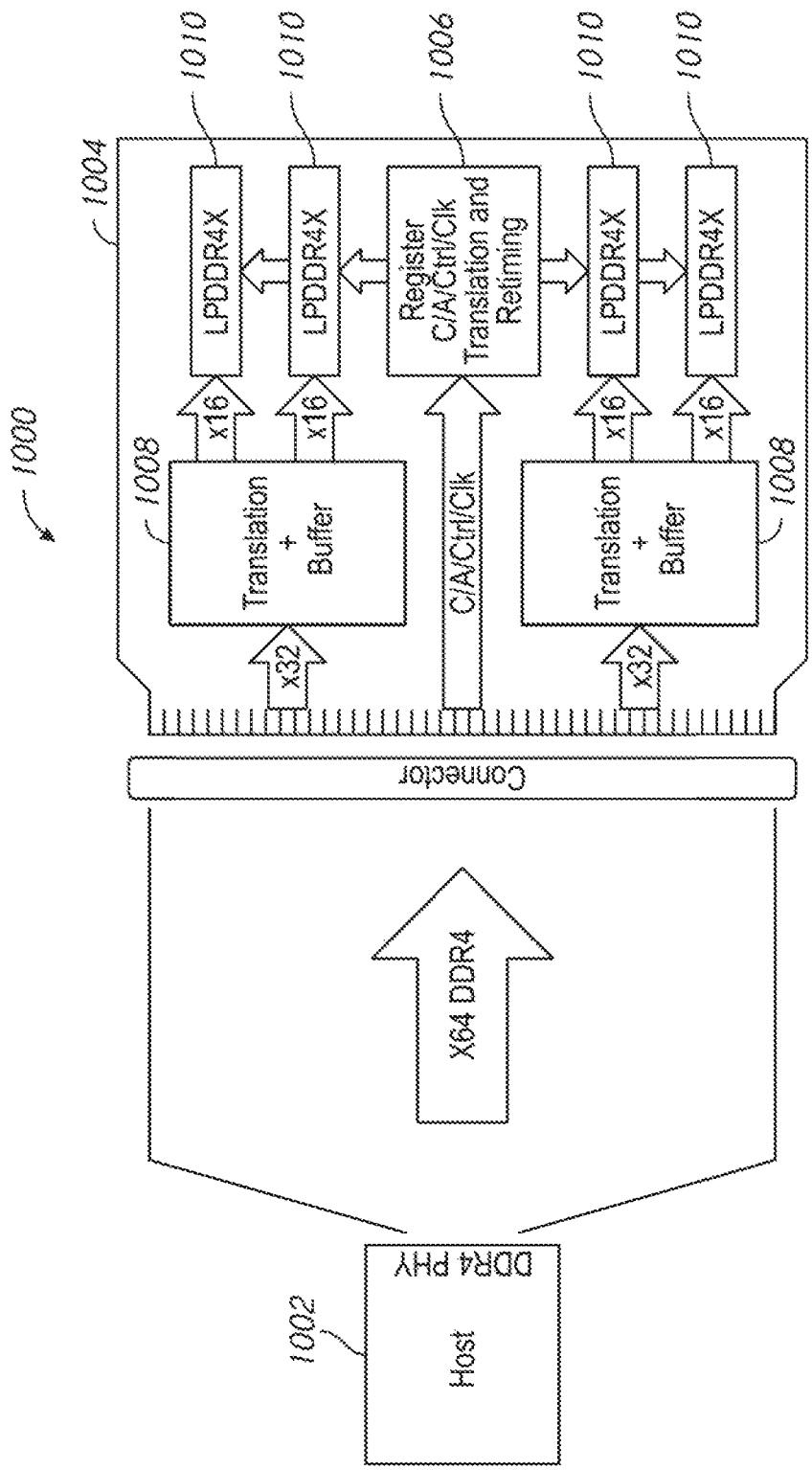
FIG. 10 is a block diagram of a buffered memory system, in accordance with an embodiment of the present invention.

While FIGS. 4-9 describe a data buffer that is configured to convert between a binary HOST_SIDE signal and a multilevel MEMORY_SIDE signal, data buffers may be used to convert between other types of communications protocols used by memory devices. FIG. 10 is a block diagram of a buffered memory system 1000 having a data buffer for translating between a standard DDR4 communications protocol and an LPDDR4x protocol, in accordance with an embodiment of the present invention. The memory system 1000 includes a host 1002 and a memory device 1004. The host 1002 may be implemented as described above with respect to the host 102 of FIG. 1. In the embodiment of FIG. 10, the host 1002 is configured to communicate with the memory device 1004 using a 64-bit bus to communicate using a DDR4 communications protocol.

The memory device 1004 includes a pair of data buffers 1008, a register 1006, and a plurality of LPDDR4x memories. Each of the data buffers 1008 may implemented as one or more of the data buffers 108(1)-(N) of FIG. 1 or data buffer 308 of FIG. 3. Each data buffer 1008 may be configured to receive 32 bits of the 64 bit DDR4 signal. Each data buffer 1008 includes translation circuits to convert the 32 bit DDR4 signal to two 16 bit wide internal signals encoded using an LPDDR4x communications protocol. The data buffers 1008 may provide each the 16 bit LPDDR4x signals to an LPDDR4x memory 1010. The LPDDR4x memories 1010 may be implemented as one or more of the memories 110(1)-(N) of FIG. 1 or the memory 210 of FIG. 2. The host 1002 may also provide command/address/control/clock information to the memory device 1004. The command/address/control/clock information may be provided to the register 1006, which may translate and/or retime the received information in accordance with the LPDDR4x communications protocol. The translated command/address/control/clock information may then be provided to one or more of the LPDDR4x memories 1010.

Figure 11:
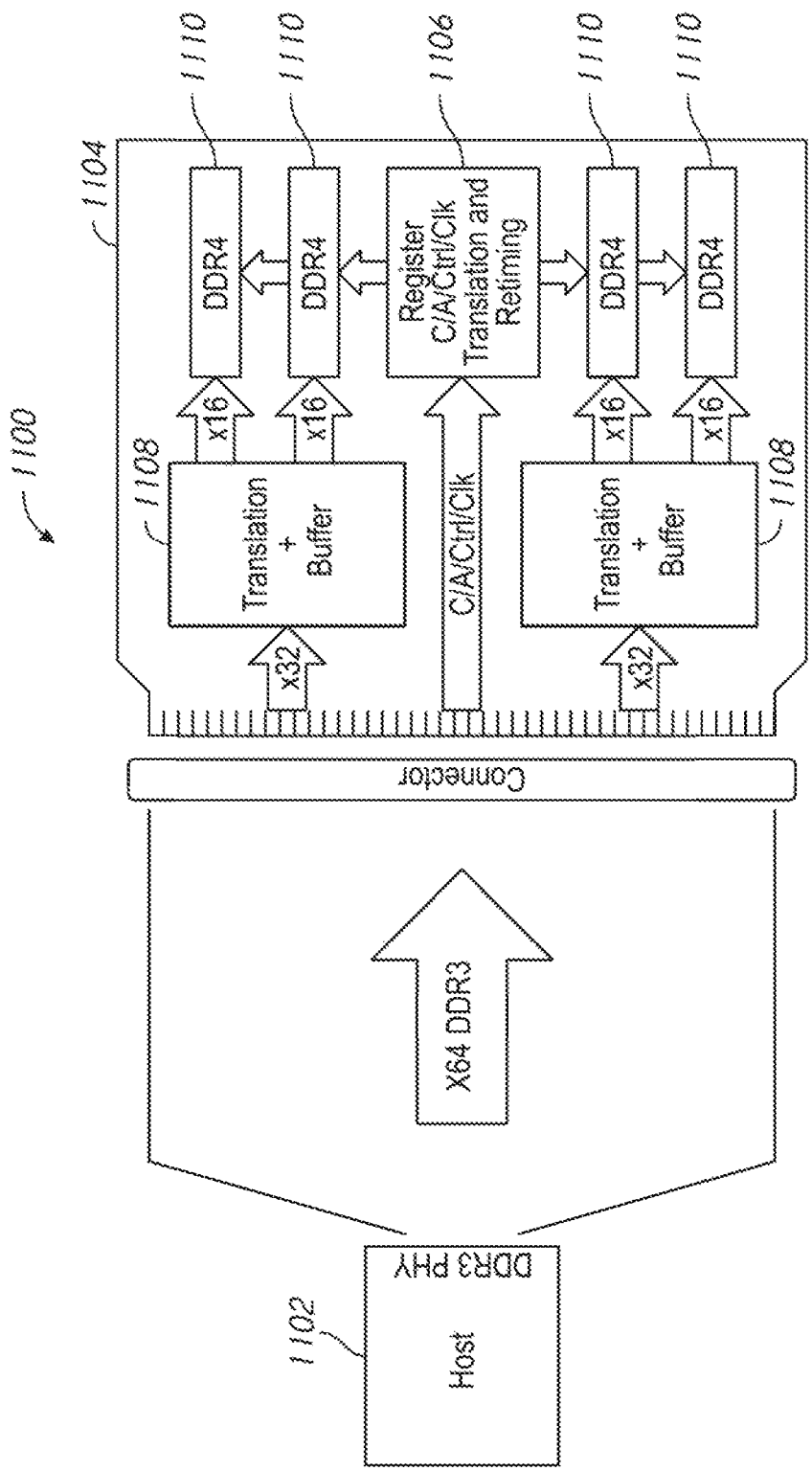
FIG. 11 is a block diagram of a buffered memory system, in accordance with embodiment of the present invention.

FIG. 11 is a block diagram of a buffered memory system 1100 having a data buffer for translating between a standard DDR3 communications protocol and a DDR4 communications protocol, in accordance with an embodiment of the present invention. The memory system 1100 includes a host 1102 and a memory device 1104. The host 1102 may be implemented as described above with respect to the host 102 of FIG. 1. In the embodiment of FIG. 11, the host 1102 is configured to communicate with the memory device 1104 using a 64-bit bus to communicate using a DDR3 communications protocol.

The memory device 1104 includes a pair of data buffers 108, a register 1106, and a plurality of DDR4 memories. Each of the data buffers 1108 may implemented as one or more of the data buffers 108(1)-(N) of FIG. 1 or data buffer 308 of FIG. 3. Each of the data buffers 1108 may be configured to receive 32 bits of the 64 bit DDR3 signal. Each data buffer 1108 includes translation circuits to convert the 32 bit DDR3 signal to two 16 bit wide internal signals encoded using an DDR4 communications protocol. The data buffers 1108 may provide each the 16 bit DDR4 signals to a DDR4 memory 1110. The DDR4 memories 1110 may be implemented as one or more of the memories 110(1)-(N) of FIG. 1 or the memory 210 of FIG. 2. The host 1102 may also provide command/address/control/clock information to the memory device 1104. The command/address/control/clock information may be provided to the register 1106, which may translate and/or retime the received information in accordance with the DDR4 communications protocol. The translated command/address/control/clock information may then be provided to one or more of the DDR4 memories 1110.

Figure 12:
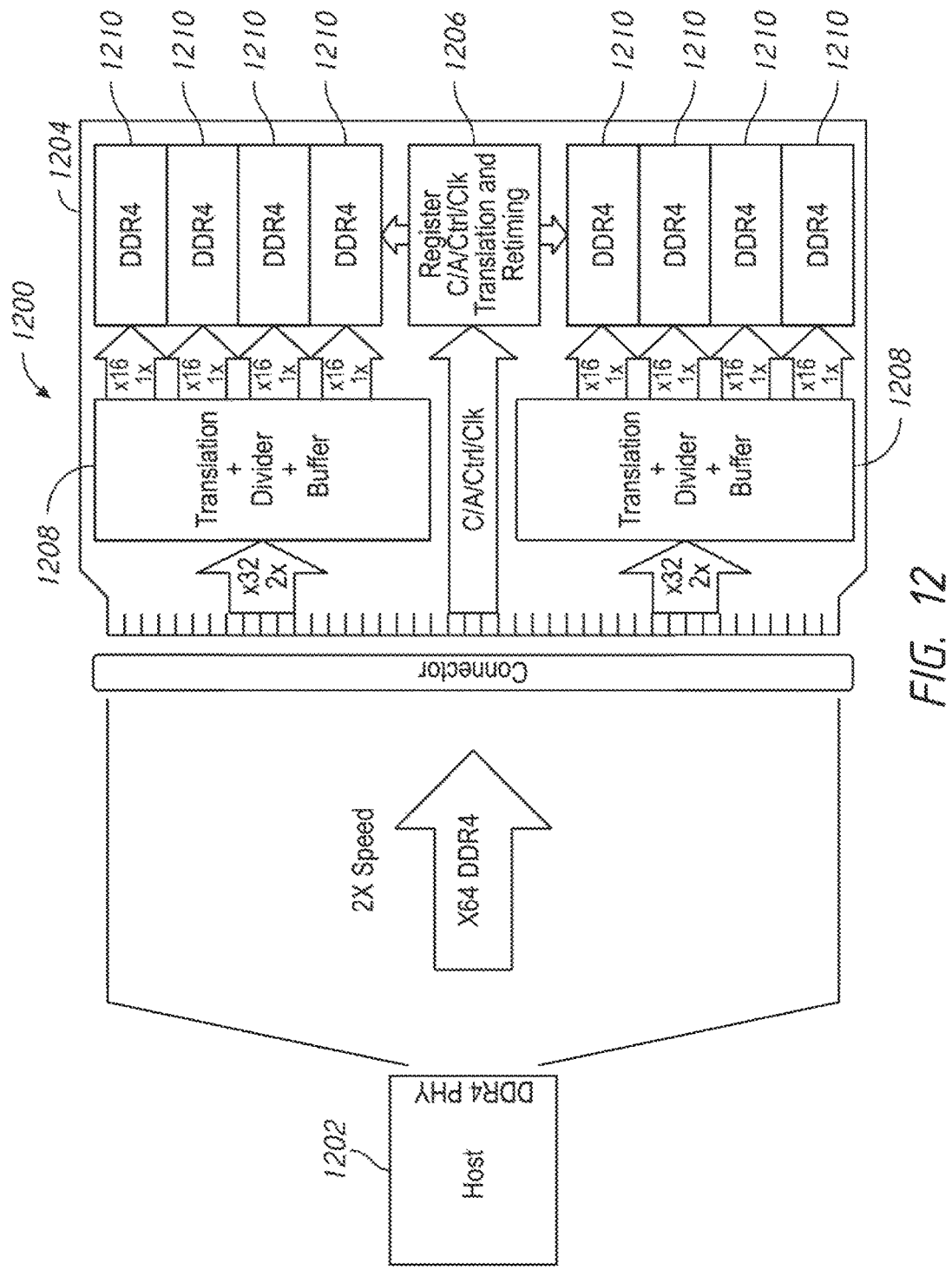
FIG. 12 is a block diagram of a buffered memory system, in accordance with an embodiment of the present invention.

FIG. 12 is a block diagram of a buffered memory system 1200 having a data buffer for translating between a DDR4 communications protocol clocked at a first frequency and, an internal DDR4 communications protocol clocked at a second frequency that is slower than the first frequency, in accordance with an embodiment of the present invention. The memory system 1200 includes a host 1202 and a memory device 1204. The host 1202 may be implemented as described above with respect to the host 102 of FIG. 1. In the embodiment of FIG. 12, the host 1202 is configured to communicate with the memory device 1204 using a 64-bit bus to communicate using a DDR4 communications protocol. However, in the embodiment of FIG. 12, the 64 bit signal is clocked at, a first frequency that is faster than the operating frequency of the memories 1210 within the memory device 1204. In one embodiment, the 62 bit signal from the host 1202 is clocked at two times the frequency of the memories 1210.

The memory device 1204 includes a pair of data buffers 1208, a register 1206, and a plurality of DDR4 memories. Each of the data buffers 1208 may implemented as one or more of the data buffers 108(1)-(N) of FIG. 1 or data buffer 308 of FIG. 3. Each of the data buffers 1208 may be configured to receive 32 bits of the 64 bit DDR4 signal. Each data buffer 1208 includes translation and divider circuits to convert the 32 bit DDR4 signal to four 16 bit wide internal signals encoded using a DDR4 communications protocol but clocked at half of the frequency of the incoming 64 bit signal. Because the incoming 64 bit signal is clocked twice as fast as the internal memories 1210, twice as much data is received by the data buffers 1208 as in the embodiment of FIG. 10. This enables the memory device 1204 to double the bandwidth while maintaining a slower clock speed, thus mitigating the negative effects of transistor reaction time within the memories 1210. The data buffers 1208 may provide each the 16 bit DDR4 signals to a DDR4 memory 1210. The DDR4 memories 1210 may be implemented as one or more of the memories 110(1)-(N) of FIG. 1 or the memory 210 of FIG. 2. The host 1202 may also provide command/address/control/clock information to the memory device 1204. The command/address/control/clock information may be provided to the register 1206, which may translate and/or retime the received information in accordance with the DDR4 communications protocol operating at half of the frequency of the incoming signal. The translated command/address/control/clock information may then be provided to one or more of the DDR4 memories 1210.

Figure 13:
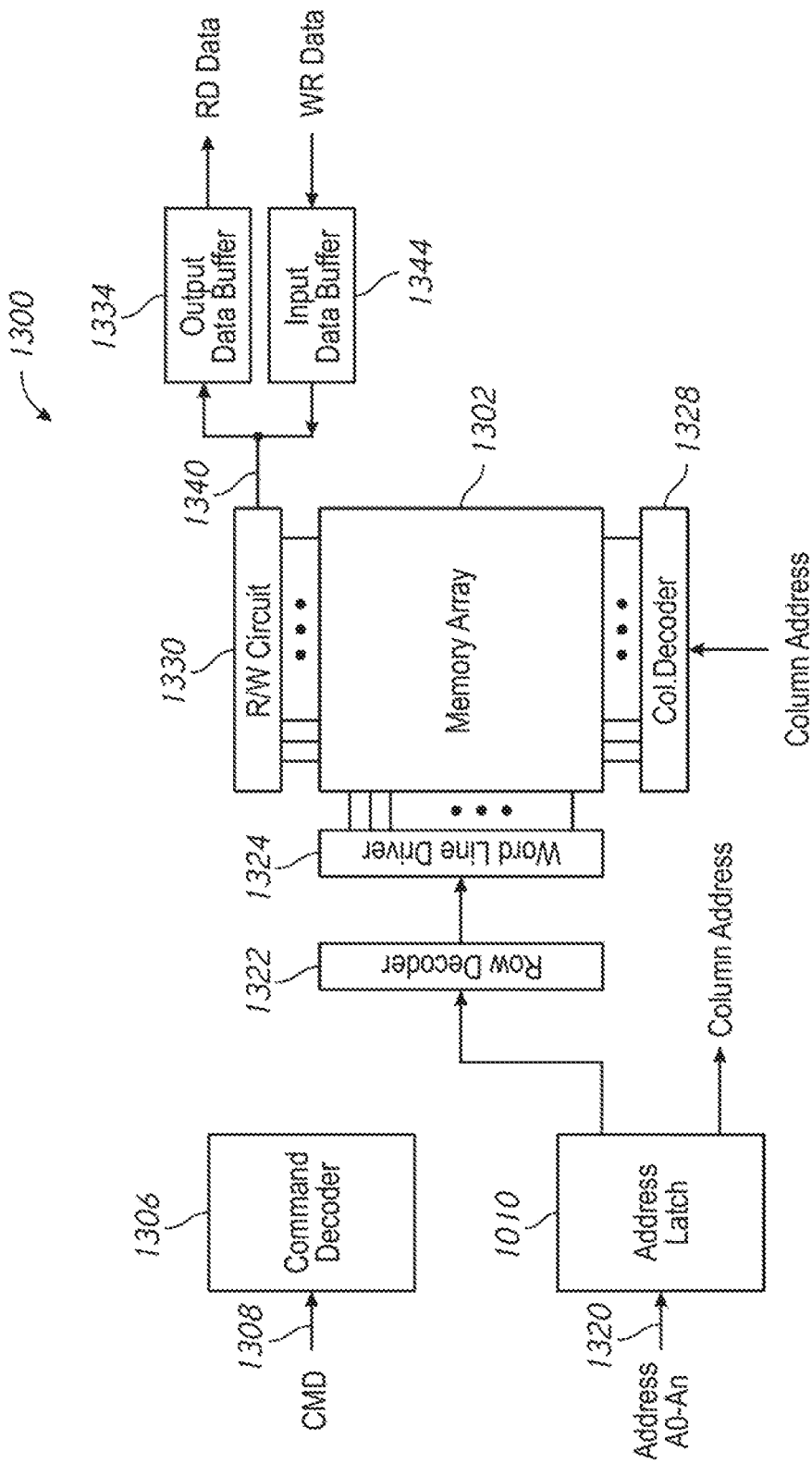
FIG. 13 is a block diagram of a memory, in accordance with an embodiment of the present invention.

FIG. 13 is a block diagram of a memory, according to an embodiment of the invention. The memory 1300 may include an array 1302 of memory cells, which may be, for example, volatile memory cells (e.g., dynamic random-access memory (DRAM) memory cells, static random-access memory (SRAM) memory cells), non-volatile memory cells (e.g., flash memory cells), or some other types of memory cells. The memory 1300 includes a command decoder 1306 that may receive memory commands through a command bus 1308 and provide (e.g., generate) corresponding control signals within the memory 1300 to carry out various memory operations. For example, the command decoder 1306 may respond to memory commands provided to the command bus 1308 to perform various operations on the memory array 1302. In particular, the command decoder 1306 may be used to provide internal control signals to read data from and write data to the memory array 1302. Row and column address signals may be provided (e.g., applied) to an address latch 1310 in the memory 1300 through an address bus 1320. The address latch 1310 may then provide (e.g., output) a separate column address and a separate row address.

The address latch 1310 may provide row and column addresses to a row address decoder 1322 and a column address decoder 1328, respectively. The column address decoder 1328 may select bit lines extending through the array 1302 corresponding to respective column addresses. The row address decoder 1322 may be connected to a word line driver 1324 that activates respective rows of memory cells in the array 1302 corresponding to received row addresses. The selected data line (e.g., a bit line or bit lines) corresponding to a received column address may be coupled to a read/write circuitry 1330 to provide read data to an output data buffer 1334 via an input-output data path 1340. Write data may be provided to the memory array 1302 through an input data buffer 1344 and the memory array read/write circuitry 1330.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

What is claimed is:

1. An apparatus comprising:
   a first data bus configured to provide a binary signal;
   a data buffer coupled to the first data bus, the data buffer configured to receive the binary signal and to convert the binary signal to a multilevel signal, wherein the data buffer comprises:
      a binary input/output circuit having a binary transmitter circuit and a binary receiver circuit coupled to the first data bus,
      a multilevel input/output circuit having a multilevel transmitter circuit and a multilevel receiver circuit coupled to the second data bus, and
      a conversion circuit coupled to the binary input/output circuit and the multilevel input/output circuit, the conversion circuit configured to convert binary signals to multilevel signals and to convert multilevel signals to binary signals, wherein the conversion circuit comprises:
         a deserialization circuit comprising a first latch configured to latch a first serial data bit received on the first data bus at a first time and a second latch configured to latch a second serial data bit received on the first data bus at a second time, and
         a parallel data synchronization circuit configured to synchronize the first serial data bit and the second data bit to generate first and second parallel data bits, wherein the multilevel transmitter circuit is configured to provide a multilevel signal based on the first and second parallel data bits;
   a second data bus coupled to the data buffer configured to provide the multilevel signal;
   a memory configured to receive the multilevel signal; and
   a timing circuit configured to provide a first clock signal having a first frequency and a second clock signal having a second frequency to the data buffer, wherein the binary signal is received at the data buffer based on the first clock signal and the multilevel signal is provided by the data buffer based on the second clock signal.

2. A method comprising:
   receiving, at a data buffer, a binary data signal comprising a plurality of serial data bits;
   converting, by the data buffer, the plurality of serial data bits to a plurality of parallel data bits, wherein converting the plurality of serial bits to the plurality of parallel bits comprises:
      latching, with a deserialization circuit, a first serial data bit at a first time;
      latching, with the deserialization circuit, a second serial data bit at a second time; and
      synchronizing, with a parallel data synchronization circuit, the first latched serial data bit and the second latched serial data bit to generate the plurality of parallel data bits;
   encoding, by the data buffer, the plurality of parallel data bits in a multilevel signal; and
   providing, by the data buffer, the multilevel signal to a memory array.

3. An apparatus comprising:
   a first data bus configured to provide a binary signal;
   a data buffer coupled to the first data bus, the data buffer configured to receive the binary signal and to convert the binary signal to a multilevel signal;

a second data bus coupled to the data buffer configured to provide the multilevel signal; and a memory configured to receive the multilevel signal, wherein the data buffer comprises:

a binary input/output circuit having a binary transmitter circuit and a binary receiver circuit coupled to the first data bus, a multilevel input/output circuit having a multilevel transmitter circuit and a multilevel receiver circuit coupled to the second data bus, and a conversion circuit coupled to the binary input/output circuit and the multilevel input/output circuit, the conversion circuit configured to convert binary signals to multilevel signals and to convert multilevel signals to binary signals, the conversion circuit comprises:

a deserialization circuit comprising a first latch configured to latch a first serial data bit received on the first data bus at a first time and a second latch configured to latch a second serial data bit received on the first data bus at a second time, and a parallel data synchronization circuit configured to synchronize the first serial data bit and the second data bit to generate first and second parallel data bits, wherein the multilevel transmitter circuit is configured to provide a multilevel signal based on the first and second parallel data bits.

4. The apparatus of claim 3, wherein the data buffer is configured to provide the multilevel signal at a lower frequency than the binary signal.

5. The apparatus of claim 3, wherein the second data bus is less than 2.0 mm.

6. The apparatus of claim 3, wherein the data buffer is further configured to receive a multilevel signal on the second data bus, to convert the multilevel signal to a binary signal, and to provide the binary signal on the first data bus.

7. The apparatus of claim 3, wherein the multilevel receiver circuit comprises a multilevel decoder circuit configured to decode multilevel signals and to provide a plurality of parallel data bits.

8. The apparatus of claim 3, wherein the conversion circuit comprises a serializer circuit configured to serialize the plurality of parallel data bits and to provide a stream of serial data bits to the binary transmitter circuit, wherein the serializer circuit comprises a first passgate configured to provide a first parallel data bit to the binary transmitter circuit at a first time and to provide a second parallel data bit to the binary transmitter circuit at a second time.

* * * * *

UNITED STATES PATENT AND TRADEMARK OFFICE
CERTIFICATE OF CORRECTION

PATENT NO. : 10,164,817 B2
APPLICATION NO. : 15/465421
DATED : December 25, 2018
INVENTOR(S) : Timothy M. Hollis et al.

Page 1 of 1

It is certified that error appears in the above-identified patent and that said Letters Patent is hereby corrected as shown below:

In the Claims

| | Reads | Should Read |
|---|---|---|
| Column 14, Line 6 | "The apparatus of claim 3, wherein the second data bus is less than 2.0 mm." | --The apparatus of claim 3, wherein the second data bus is less than 20 mm.-- |

Signed and Sealed this
Twelfth Day of March, 2019

Andrei Iancu
*Director of the United States Patent and Trademark Office*